US011315623B2

United States Patent
Gyllenskog

(10) Patent No.: US 11,315,623 B2
(45) Date of Patent: Apr. 26, 2022

(54) TECHNIQUES FOR SATURATING A HOST INTERFACE

(71) Applicant: Micron Technology, Inc., Boise, ID (US)

(72) Inventor: Christian M. Gyllenskog, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 16/917,508

(22) Filed: Jun. 30, 2020

(65) Prior Publication Data
US 2021/0407573 A1    Dec. 30, 2021

(51) Int. Cl.
*G11C 8/00* (2006.01)
*G11C 11/4076* (2006.01)
*G11C 11/4096* (2006.01)
*G11C 11/4093* (2006.01)
*G11C 11/406* (2006.01)

(52) U.S. Cl.
CPC ...... *G11C 11/4076* (2013.01); *G11C 11/4093* (2013.01); *G11C 11/4096* (2013.01); *G11C 11/40603* (2013.01)

(58) Field of Classification Search
CPC ............ G11C 11/4096; G11C 11/4093; G11C 11/4076; G11C 11/40603
See application file for complete search history.

(56) References Cited

U.S. PATENT DOCUMENTS

| | | | | |
|---|---|---|---|---|
| 2011/0035540 | A1* | 2/2011 | Fitzgerald | G06F 3/061 711/103 |
| 2013/0166932 | A1* | 6/2013 | Iarovici | G06F 1/3231 713/323 |
| 2013/0290606 | A1* | 10/2013 | Alessi | G06F 1/3275 711/103 |
| 2019/0347034 | A1* | 11/2019 | Hasbun | G06F 3/0688 |
| 2021/0133111 | A1* | 5/2021 | Lee | G06F 9/544 |

* cited by examiner

*Primary Examiner* — Uyen Smet
(74) *Attorney, Agent, or Firm* — Holland & Hart LLP

(57) ABSTRACT

Methods, systems, and devices related to techniques for saturating a host interface are described. A set of data stored at a first memory device may be communicated over an interface during a read operation performed in response to receiving a read request associated with the set of data. A control component may determine if the interface entered an idle state during portions of the read operation. Based on detecting an idle state of the interface, the control component may transfer the set of data from the first memory device to a second memory device. After receiving a second read request for the set of data, the memory device may access the set of data from the second memory device and communicate the set of data over the interface, where the interface may remain in a saturated state throughout the second read operation.

25 Claims, 6 Drawing Sheets

TECHNIQUES FOR SATURATING A HOST INTERFACE

BACKGROUND

The following relates generally to one or more memory systems and more specifically to techniques for saturating a host interface.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
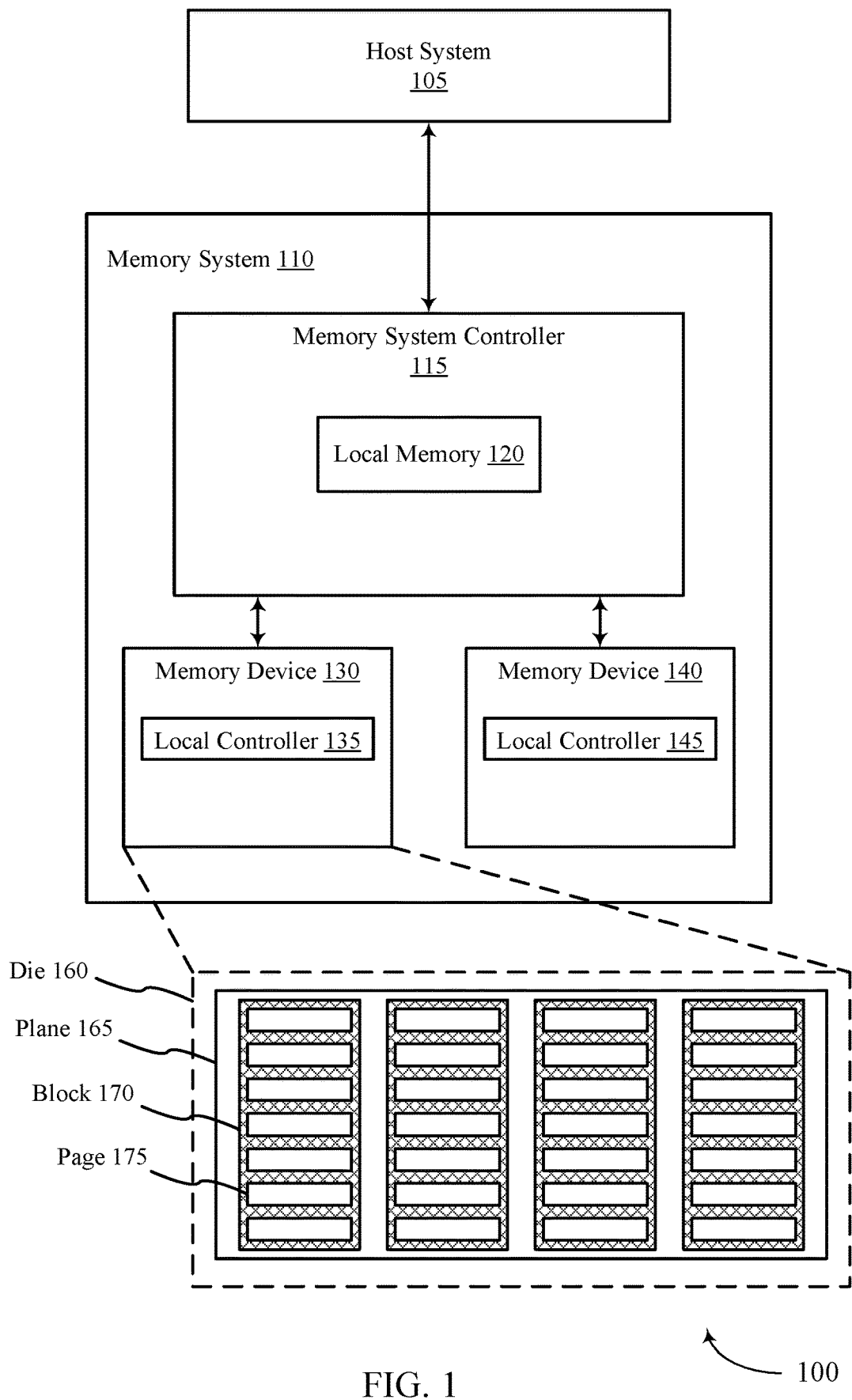
FIG. 1 illustrates an example of a system that supports techniques for saturating a host interface in accordance with examples as disclosed herein.

A memory system may include one or more memory devices (e.g., a NAND memory device, a storage class memory device, or both) and a host interface. The memory system may be used to store information for a host system. The host interface may be used to communicate data between the memory system and the host system and may support data rates up to a maximum (or threshold) data rate. When data is communicated over the host interface at the maximum data rate, the host interface may be referred to as being "saturated." When data is not being communicated over the host interface, the host interface may be referred to as being "idle." Transferring a set of data over the host interface at a data rate that is below the maximum data rate may involve the host interface being idle for some portion of the time period over which the set of data is transferred.

A NAND memory device may be non-volatile and capable of saturating a host interface (e.g., providing data in response to read commands with sufficiently low latency that the host interface becomes saturated) when sequential read operations (which may be associated with efficiently accessible data) are triggered by a request from a host system, but may fail to saturate the host interface when random (e.g., non-sequential, scattered) read operations (which may be associated with less-efficiently accessible data) are triggered by the request. By contrast, at least some types of storage class memory devices, which in some cases may also be non-volatile, may be capable of saturating a host interface regardless of whether sequential or random read operations are performed.

In some cases, a host system may request data from a memory system in a predictable fashion—e.g., based on an application of the host system. For example, a host system may frequently repeat certain patterns of requests for data stored in a memory system. Additionally, certain types of host systems may cause a memory system to perform an increased or decreased amount of sequential read operations—e.g., based on an application associated with the host system. Thus, a host interface may be saturated in response to a smaller portion of read commands (or idle for at least some time in response to a greater portion of read commands) when coupled with a host system that is associated with a decreased amount of sequential read operations. Whenever a host interface is not saturated, a data transfer capability of the memory system may be less than fully utilized.

According to aspects described herein, enhanced techniques may be used for moving, from a NAND memory device to a storage class memory device, a set of data if a read command for the set of data causes the host interface to enter an idle state (e.g., due to a relatively high latency associated with reading the set of data from the NAND memory device). In some examples, in response to a request for a set of data, a memory system may identify that the set of data is stored in a NAND memory device. In response to the request for the set of data, the memory system may retrieve the set of data from the NAND memory device and communicate the set of data to the host system over the host interface. In some cases (e.g., due to a latency associated with retrieving the set of data from the NAND memory device), the host interface may enter an idle state between a first time at which the memory system completes communicating a previously requested set of data over the host interface and a second time at which the memory system finishes communicating the newly requested set of data over the host interface. Additionally or alternatively, the set of data may be communicated over the host interface at a data rate that is below a maximum data rate supported by the host interface. Based on determining that the host interface became unsaturated based on reading the set of data (e.g., the memory system may determine the host interface entered the idle state), the memory system may move the set of data from the NAND memory device to a storage class memory device.

Later, the memory system may receive from the host system a subsequent request for the set of data. In response, the memory system may identify that the set of data is now stored in the storage class memory device, may retrieve the set of data from the storage class memory device, and may communicate the set of data to the host system over the host interface. The storage class memory device may support a lower latency or higher data rate in response to random read operations. By having moved the set of data to the storage class memory device, the host interface may remain in a saturated state (or enter the idle state a fewer number of times) while the set of data is being communicated to the host interface in response to the subsequent request for the set of data.

In some examples, a memory system may receive, from a host system, multiple requests for sets of data stored in a NAND memory device. In some cases, the multiple requests may be associated with a common sequence (or pattern) of requests that is repeatedly received at the memory system. The sequence of request may be referred to as a read request pattern. In some cases, the memory system may determine that the multiple requests are associated with an established sequence (or pattern) of requests. The memory system may also communicate the requested sets of data to the host system. While the sets of data are being communicated, the host interface may enter an idle state and/or the sets of data may be communicated over the host interface at a data rate that is below a maximum data rate supported by the host interface. For example, a latency or data rate associated with providing the requested sets of data to the host system may be impacted by how the different requested sets of data are stored within the NAND memory device relative to the read request pattern. The memory system may move the sets of data from the NAND memory device to a storage class memory device based on determining that the host interface entered the idle state. Based on identifying sequences (e.g., patterns) of requests that fail to maintain the host interface in a saturated state, the memory system may alternative or transfer larger amounts of data to a storage class memory device (e.g., relative to identifying and moving individual sets of data). In some cases, the memory system may move sets of data from the NAND memory device to the storage class memory device based on determining that the host interface has entered the idle state a threshold number of times as a result of receiving of an associated sequence (or pattern) of requests. By monitoring how often a sequence (or pattern) of requests results in a failure to saturate the host interface, the memory system may avoid moving infrequently accessed sets of data to a storage class memory device, or moving data to the storage class memory device with excessive frequency.

Features of the disclosure are initially described in the context of systems, devices, and circuits as described with reference to FIG. 1. Features of the disclosure are described in the context systems and process diagrams as described with reference to FIGS. 2 and 3. These and other features of the disclosure are further illustrated by and described with reference to an apparatus diagram and flowcharts that relate to techniques for saturating a host interface as described with reference to FIGS. 4-6.

FIG. 1 is an example of a system 100 that supports techniques for saturating a host interface in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The host system 105 may be coupled with the memory system 110. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, serial advanced technology attachment (SATA) controller). The host system 105 may use the memory system 110, for example, to write data to the memory system 110 and read data from the memory system 110. Though one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a peripheral component interconnect express (PCIe) interface, USB interface, Fiber Channel, Small Computer System Interface (SCSI), Serial Attached SCSI (SAS), a double data rate (DDR) memory bus, a DIMM (e.g., DIMM socket interface that supports Double Data Rate (DDR)), Open NAND Flash Interface (ONFI), Double Data Rate (DDR), Low Power Double Data Rate (LPDDR). In some cases, the host system 105 may be coupled with the memory system 110 via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. Though one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface). The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 ("host commands/requests") and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands ("memory commands") to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 140 or memory devices 130. For example, the memory system controller 115 may execute or manage operations such as wear-leveling operations, garbage collection operations, error checking operations or error correcting code (ECC) operations such as error-detecting operations or error-correcting operations, encryption operations, caching operations, media management operations, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may be or include one or more memory dies, which may include one or more arrays of a second type of memory cells (e.g., a type of volatile memory cells or a different type of non-volatile memory cell from memory device 130). For example, a memory device 140 may include 3-dimensional Xpoint (3DXP) memory, ferroelectric RAM (FeRAM), phase change memory (PCM), magnetoresistive RAM (MRAM), self-selecting memory, NOR (e.g., NOR flash) memory, Spin Transfer Torque (STT)-MRAM, conductive bridging RAM (CBRAM), resistive random access memory (RRAM), oxide based RRAM (OxRAM), or random access memory (RAM) memory cells, such as dynamic RAM (DRAM) memory cells or synchronous DRAM (SDRAM) memory cells. In some examples, a memory device 140 may support random (or scattered) access operations (e.g., by the host system 105) with reduced latency relative to a memory device 130, or may offer one or more other performance differences relative to a memory device 130.

A memory device 130 may include one or more arrays of a first type of memory cells (e.g., a type of non-volatile memory cells). For example, a memory device 130 may include NAND (e.g., NAND flash) memory, ROM, and electrically erasable programmable ROM (EEPROM).

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to single-level memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may not be updated without the entire block 170 that includes the page 175 being erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete, and update an L2P mapping table to associate the logical address (e.g., LBA) for the data with the new, valid block 170 rather than the old, invalid block 170. In some cases, such copying and remapping may be preferable to erasing and rewriting the entire old block 170, due to latency or wearout considerations, for example. In some cases, one or more copies of an L2P mapping table may be stored within the memory cells of the memory device 130 (e.g., within or more blocks 170 or planes 165) for use (e.g., reference and updating) by the local controller 135 or memory system controller 115. In other examples, the system 100 may have one or more copies of the L2P mapping table stored within the memory cells of the memory device 140 for use by the memory system controller 115.

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

As discussed above, the memory system 110 may store data for the host system 105 in the NAND memory device 130. In some examples, a memory device (e.g., the memory device 130 or the memory device 140) may perform (or execute), based on receiving a read request from the host system 105, a read operation to access one or more memory cells that store data for the host system 105. In some cases, requests for data may be associated with either sequential read operations or random read operations. Sequential read operations may refer to read operations used to access a set of data that has been stored in the memory device in an easily accessible (or efficient) fashion. For example, sequential read operations may refer to read operations used to access data stored in physically contiguous memory locations. Random read operations may refer to read operations used to access a set of data that has been stored in a less-accessible fashion. For example, random read operations may refer to read operations used to access data stored in physically non-contiguous memory locations. An increased number of operations may be performed at the NAND memory device 130 to access a full set of data requested by a random read operation (or set thereof) relative to a sequential read operation (or set thereof).

For the NAND memory device 130, the data transfer rate may be based on a nature of one or more read operations executed at the NAND memory device 130. For example, the data transfer rate of a NAND memory device 130 may be faster when sequential read operation(s) are performed relative to when random read operation(s) are performed. For NAND memory, sequential read operations may refer to read operations that access data stored in correlated memory locations across multiple planes 165. For NAND memory, sequential read operations may also refer to read operations that access data stored in consecutive memory locations of one or more planes 165. Also, for NAND memory, random read operations may be associated with reading sets of data that have been stored in non-consecutive memory locations within a single plane 165 or across different planes 165.

In some examples, the memory device 140 may include storage class memory cells and may be referred to as a storage class memory device 140. In some cases, the NAND memory device 130 may have a larger storage capacity than the storage class memory device 140, and the NAND memory device 130 may be referred to as the main memory device of the memory system 110. In some cases, a storage class memory device 140 may also include non-volatile memory cells (such as phase change memory cells, ferroelectric memory cells, or any combination thereof), but may be configured to exchange data at a rate that is faster (additionally or alternatively, a latency that is lower) than the NAND memory device 130. In some examples, the storage class memory device 140 may exchange data at similar or higher rates than the NAND memory device 130 when sequential read operations are performed. The storage class memory device 140 may also exchange data at higher data rates than the NAND memory device 130 when random read operations are performed. The storage class memory device 140 may be used to store L2P mapping tables. The storage class memory device 140 may also be used to temporarily store data for the host system 105—e.g., a storage class memory device 140 may be used as a write cache that stores data prior to writing the data to the NAND memory device 130.

The physical host interface may be used to communicate data between the memory system 110 and the host system 105 and may support data transfer rates up to a maximum data transfer rate. Thus, when the physical host interface is saturated, the data transfer rate of a memory system 110 may be based on (e.g., limited by) the maximum data rate of the physical host interface, regardless of a data rate supported by the memory devices. In some examples, the data transfer rate of the memory system 110 may be equal to or greater than a data transfer rate of the host system 105. When the data transfer rate of the memory system 110 is equal to or exceeds the data transfer rate of the physical host interface, the physical host interface may be referred to as being saturated—e.g., because a capacity of the physical host interface to communicate data may be fully utilized. In some cases, a physical host interface that is saturated may also be referred to as being in a saturated state.

In other examples, the data transfer rate of the memory system 110 may be less than the data transfer rate of the physical host interface. When the data transfer rate of the memory system 110 is less than the data transfer rate of the physical host interface, the physical host interface may (temporarily) enter an idle or reduced-utilization state during a data transfer—e.g., when data is not being communicated, or is being communicated at a reduced rate, over the physical host interface. In some examples, the data transfer rate supported by the memory system 110 may be equal to or greater than a data transfer rate of the physical host interface when sequential read operations are performed at NAND memory device 130 and less than the data transfer rate of the physical host interface when random read operations are performed at NAND memory device 130. By contrast, the data transfer rate supported by a memory system 110 may be equal to or greater than a data transfer rate of the physical host interface regardless of whether sequential read operations or random read operations are performed at storage class memory device 140.

The host system 105 may request data stored in the memory system 110 on an as-needed basis. In some cases, host systems 105 may request data from a memory system in a predictable or recurring manner. For example, the host system 105 may send some sequences of commands or requests (which may also be referred to as a command or request pattern) repeatedly during operation. Additionally, certain host systems 105 may be associated with different combinations of read operations that are performed at a memory system 110. For example, a host system 105 that uses the memory system 110 to store media content may cause a higher amount of sequential read operations (and a reduced amount of random read operations) to be performed at the memory system 110 relative to other host systems 105. When the host system 105 is associated with a higher proportion of sequential read operations, the memory system 110 may more frequently saturate the physical host interface when accessing the NAND memory device 130—i.e., the physical host interface may less frequently be in an idle state. Other types of host systems 105 (e.g., cellular or automotive applications) may be associated with read operations having a reduced proportion of sequential read operations (and an increased amount of random read operations). When a host system 105 is associated with a lower proportion of sequential read operations, a corresponding memory system 110 may less frequently saturate the physical host interface when accessing the NAND memory device 130—i.e., the physical host interface may more frequently be in an idle state. Failing to saturate a host interface may prevent a data transfer capability of the memory system from being fully utilized.

To obtain an increased, or full, utilization of a data transfer capability of a memory system 110, techniques as described herein may be used for moving, from a NAND memory device 130 to a storage class memory device 140, a set of requested data that causes the physical host interface to enter an idle state. In some examples, a memory system 110 may identify a set of data that is stored in a NAND memory device 130 in response to a request for the set of data. In response to the request for the set of data, the memory system 110 may execute a read operation and communicate the set of data to the host system 105 over the physical host interface. While the set of data is being communicated, or at some time between communication a prior set of data and the set of data, the physical host interface may enter an idle state. Alternatively, the set of data may be communicated over the physical host interface at a data rate that is below a maximum data rate supported by the physical host interface. The memory system 110 may move the set of data from the NAND memory device 130 to a storage class memory device 140 based on determining that the physical host interface was not saturated at some time associated with the read operation (e.g., the memory device may determine the memory device entered the idle state). Later, the memory system 110 may receive a subsequent request for the set of data from the host system 105. The memory system 110 may identify, in response to the subsequent request, that the set of data is stored in the storage class memory device 140 and may communicate the set of data to the host system 105. Due to having previously moved the set of data to the storage class memory device 140, the physical host interface may remain in a saturated state (or enter the idle state a fewer number of times) throughout a time period associated with providing the set of data over the physical host interface in response to the subsequent request (e.g., while communicating the set of data over the physical host interface, or throughout a time period between receipt of the subsequent request and completion of communicating the set of data over the physical host interface).

In some examples, a memory system 110 may receive, from a host system 105, multiple requests for sets of data stored in a NAND memory device 130. In some cases, the multiple requests may be associated with (e.g., may be) a sequence (or pattern) of requests that is repeatedly received at the memory system 110. The sequence of requests may be referred to as a read request pattern. In some cases, the memory system 110 may determine that the multiple requests are associated with an established (or known, previously identified) sequence (or pattern) of requests. While the sets of data are being communicated in response to the sequence of requests (e.g., between a first time when data included in the sets of data begins being communicated over the physical host interface and a second time when all the data included in the sets of data has been communicated over the physical host interface), the physical host interface may enter an idle state and/or the sets of data may be communicated over the physical host interface at a data rate that is below a maximum data rate supported by the physical host interface. The memory system 110 may move the sets of data from the NAND memory device 130 to a storage class memory device 140 based on determining that the physical host interface entered the idle state while the sets of data were being communicated. By identifying sequences of requests that fail to saturate a physical host interface, the memory system 110 may transfer larger or different sets of data to a storage class memory device 140 (e.g., relative to moving a single set of data based on single data requests). In some cases, the memory system 110 may move the set of data from the NAND memory device 130 to the storage class memory device 140 based on determining that the physical host interface has entered the idle state a threshold number of times as a result of receiving of the sequence (or pattern) of requests. By monitoring how often a sequence (or pattern) of requests fails to saturate a physical host interface, the memory system 110 may, for example, avoid moving infrequently accessed sets of data to a storage class memory device 140.

Figure 2:
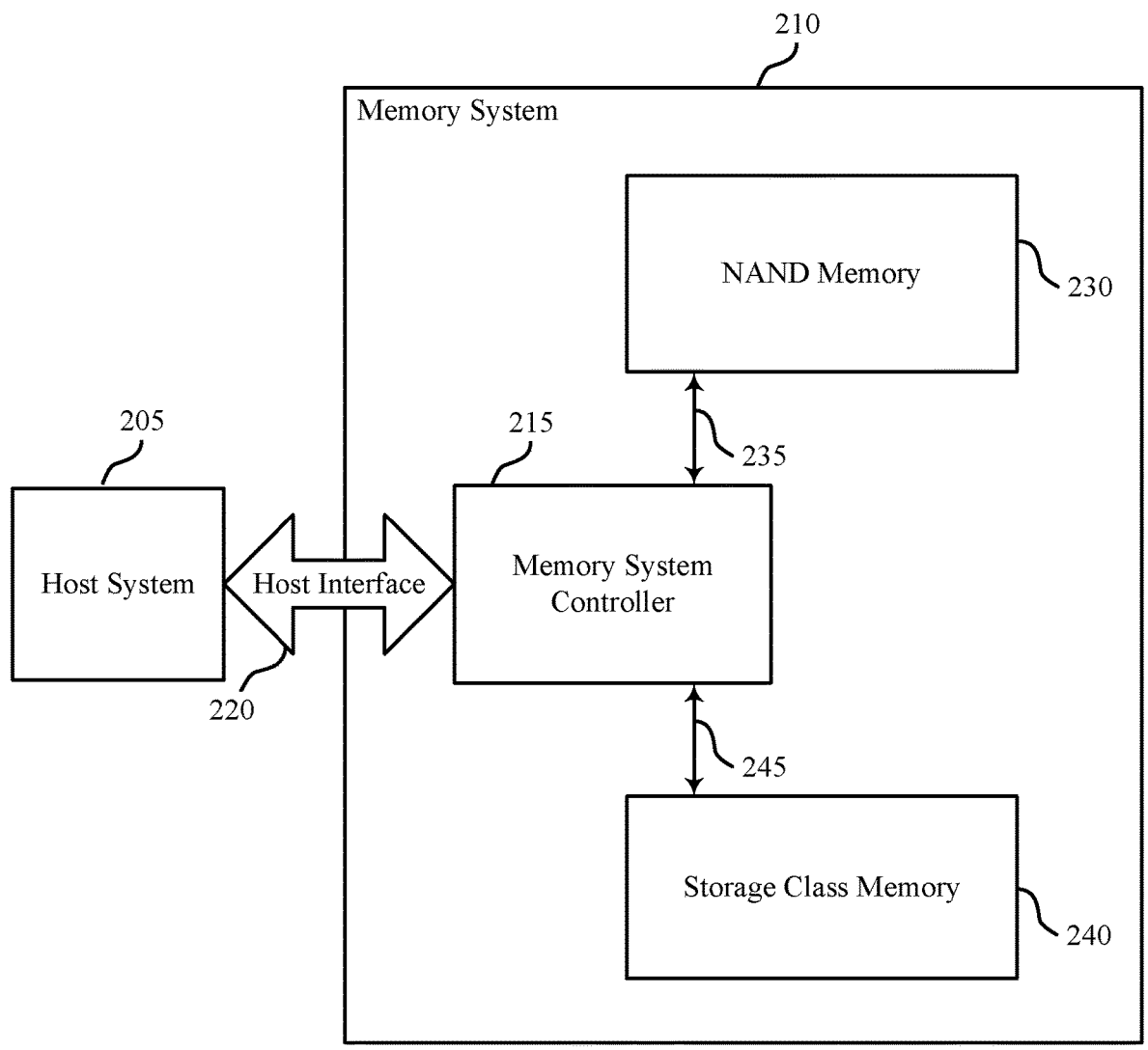
FIG. 2 illustrates an example of a system that supports techniques for saturating a host interface in accordance with examples as disclosed herein.

FIG. 2 illustrates an example system 200 that supports techniques for saturating a host interface in accordance with examples as disclosed herein. System 200 may include host system 205, memory system 210, and host interface 220. Host system 205 may be an example of host system 105, as described with reference to FIG. 1. Memory system 210 may be an example of memory system 110, as described with reference to FIG. 1. Memory system 210 may include memory system controller 215, NAND memory 230, storage class memory 240, first data bus 235, and second data bus 245.

Host interface 220 may be configured to communicate requests and data between host system 205 and memory system 210. For example, a set of data may be communicated over host interface 220 in response to a request from host system 205. In some examples, the set of data may be communicated over host interface 220 at a maximum data rate (e.g., threshold data rate) supported by host interface 220. In such cases, host interface 220 may be in a saturated state. In other examples, data may be communicated over host interface 220 at a data rate below the maximum data rate. That is, host interface 220 may be in an idle or reduced-utilization state while communicating one or more sets of data—e.g., there may be periods when there is an absence of data being communicated over host interface 220. Host interface 220 may be an example of a physical host interface, as described with reference to FIG. 1.

NAND memory 230 may be configured to store data for host system 205 and provide data to host system 205 based on requests received from host system 205. NAND memory 230 may access and read data in a sequential order. In other examples, the NAND memory may access and read data in a random fashion (e.g., a scattered read). That is, the random read may be a non-sequential and random read of memory cells in NAND memory 230. In some examples, the duration to perform a sequential read may be shorter than a duration to perform a random read. NAND memory 230 may be an example of memory device 130, as described with reference to FIG. 1.

Storage class memory 240 may be configured to be used as a write cache for NAND memory 230 or store L2P tables for memory system 210. Storage class memory 240 may also be configured to have a lower read latency than NAND memory 230, at least with respect to random reads. That is, storage class memory 240 may be able to access and read data at the same rate or faster than NAND memory 230 for sequential reads and faster (e.g., with less latency) for random reads. In some examples, NAND memory 230 and storage class memory 240 may share a common data bus. Storage class memory 240 may be an example of memory device 140, as described with reference to FIG. 1.

First data bus 235 may be configured to communicate requests and data between memory system controller 215 and NAND memory 230. Second data bus 245 may be configured to communicate requests and data between memory system controller 215 and storage class memory 240.

Memory system controller 215 may be configured to transfer data from NAND memory 230 to storage class memory 240. Memory system controller 215 may further be configured to update L2P tables, detect patterns associated with read requests, and determine the quantity of times a pattern has been performed. Memory system controller 215 may be configured to detect a state (e.g., saturated or idle) of host interface 220. Memory system controller 215 may be configured to receive requests (e.g., read requests, write requests, etc.) from host system 205. In some cases, the requests received from host system 205 may be referred to as commands (e.g., read commands, write commands, etc.). Memory system 210 may be configured to perform access operations (e.g., a read operation, write or program operation, erase operation, refresh operation, etc.) based on the received requests. Memory system controller 215 may be an example of memory system controller 115, as described with reference to FIG. 1.

In some examples, memory system controller 215 may receive, from host system 205, a read request for a set of data located in NAND memory 230. In some cases, the set of data may be stored in contiguous and/or common (or parallel) memory locations throughout NAND memory 230. For example, the page addresses of the data segments included in the set of data may be sequential. Additionally, or alternatively, the page addresses of the data segments included in the set of data may be the same, while the plane addresses of the data segments may be different. In other cases, the set of data may be stored in locations that are scattered throughout NAND memory 230. For example, the page addresses of the data segments included in the set of data may be non-sequential and/or randomized.

In response to receiving the read request, memory system controller 215 may initiate a read operation at NAND memory 230. In some examples, the set of data requested may be stored sequentially and thus may be read sequentially from NAND memory 230 during the read operation. For example, the set of data may be read sequentially from NAND memory 230 when the set of data is stored in contiguous memory locations—that is, memory cells corresponding to sequential LBAs may be read. Additionally, or alternatively, the set of data may be read sequentially from NAND memory 230 when the same page address is accessed across multiple planes of NAND memory 230. In some examples, the set of data requested may be stored within NAND memory 230 in a scattered fashion and thus may not be read sequentially. For example, the set of data subject to the read request may be stored within NAND memory 230 in a scattered fashion when the set of data is randomly scattered across NAND memory 230—e.g., when the data is stored in various memory cells that are scattered across a user data area (UDA). In some examples, a latency for sequentially reading the set of data from NAND memory 230 may be shorter than a latency for scattered reads (e.g., reads of one or more sets of data that are stored in NAND memory 230 in a scattered fashion).

As part of the read operation, memory system controller 215 may output, via host interface 220, the set of data from NAND memory 230 to host system 205. A data rate or latency with which the set of data is communicated over host interface 220 may depend on whether the set of data is read sequentially or in a scattered fashion from NAND memory 230. In some examples, the set of data may be communicated over host interface 220 at a data rate that matches a maximum data rate supported by host interface 220—e.g., when a read operation for NAND memory 230 is a sequential read operation. In such cases, host interface 220 may remain in a saturated state throughout the read operation. In other examples, the set of data may be communicated over host interface 220 at a data rate that is below the maximum data rate supported by the host interface—e.g., when the set of data is accessed in a scattered fashion. In such cases, host interface 220 may transition between an idle state and a saturated state during the read operation. That is, there may be periods during the read operation when there is an absence of data being communicated over host interface 220.

To determine whether host interface 220 entered an idle state during the read operation, memory system controller 215 may monitor the communication of the set of data over host interface 220. In some examples, to determine if host interface 220 entered the idle state during a read operation, memory system controller 215 may calculate a threshold duration for communicating the set of data over host interface 220 that would result in host interface 220 remaining in the saturated state. Memory system controller 215 may also determine an actual duration for communicating the set of data over host interface 220. Memory system controller 215 may compare the actual duration with the threshold duration to determine if host interface 220 remained in a saturated state throughout the read operation. If the actual duration used for communicating the set of data exceeds the threshold duration, memory system controller 215 may determine that host interface 220 entered an idle state during the read operation. That is, memory system controller 215 may determine that host interface 220 did not remain in the saturated state throughout the read operation.

Additionally, or alternatively, memory system controller 215 may determine if host interface 220 entered the idle state during a read operation by calculating a threshold data rate (or data transfer rate) for communicating the set of data over host interface 220 that would result in host interface 220 remaining in the saturated state. Memory system controller 215 may also determine an actual data rate for communicating the set of data over host interface 220. Memory system controller 215 may compare the actual data rate with the threshold data rate to determine if host interface 220 remained in a saturated state throughout the read operation. If the actual data rate used for communicating the set of data is below the threshold data rate, memory system controller 215 may determine that host interface 220 entered an idle state during the read operation.

Additionally, or alternatively, memory system controller 215 may determine if host interface 220 entered the idle state during a read operation by monitoring host interface 220 for an absence of data communication throughout the performance of the read operation. If memory system controller 215 determines that, during a read operation, data is not communicated over host interface 220 for a period of time, memory system controller 215 may determine that host interface 220 entered an idle state during the read operation. In some cases, memory system controller 215 may determine that data is not being communicated over host interface 220 based on determining that a measured signal power is below a threshold. In some examples, a host interface component that is coupled with host interface 220 may be configured to send, to memory system controller 215, an indication that there is an absence of data being communicated over host interface 220.

Memory system controller 215 may manage data (e.g., the storage location thereof) within memory system 210 based on determining whether host interface 220 entered an idle state during a read operation. For example, if the memory system controller determines that host interface 220 remains in a saturated state during the communication of the set of data, the memory system controller 215 may retain the set of data stored in NAND memory 230. Otherwise, if memory system controller 215 determines host interface 220 enters a saturated state while communicating the set of data, memory system controller 215 may initiate a data migration operation for the set of data. That is, memory system controller 215 may transfer the set of data from NAND memory 230 to storage class memory 240. Transferring the set of data from NAND memory 230 to storage class memory 240 may include erasing the set of data from NAND memory 230. That is, the set of data may be transferred rather than copied to storage class memory 240. Memory system controller 215 may also update the L2P tables to indicate that the set of data has been migrated from NAND memory 230 to storage class memory 240—e.g., the L2P tables may be updated to show that the set of data is now located in storage class memory 240.

After transferring the set of data to storage class memory 240, memory system controller 215 may receive a second read command associated with the set of data. Memory system controller 215 may then initiate a second read operation at storage class memory 240 based on the set of data having been previously transferred to storage class memory 240. As storage class memory 240 has a lower read latency than NAND memory 230, host interface 220 may remain in a saturated state when the set of data is communicated over host interface 220—regardless of whether the set of data is read from storage class memory 240 in a sequential or scattered fashion. During the read operation, memory system 210 may monitor the communication of the set of data and determine that host interface 220 remains in the saturated state during the second read operation. By migrating the set of data to storage class memory 240, memory system 210 may saturate host interface 220 in response to subsequent read requests for the set of data and thereby improve the overall performance of the system 200.

Figure 3:
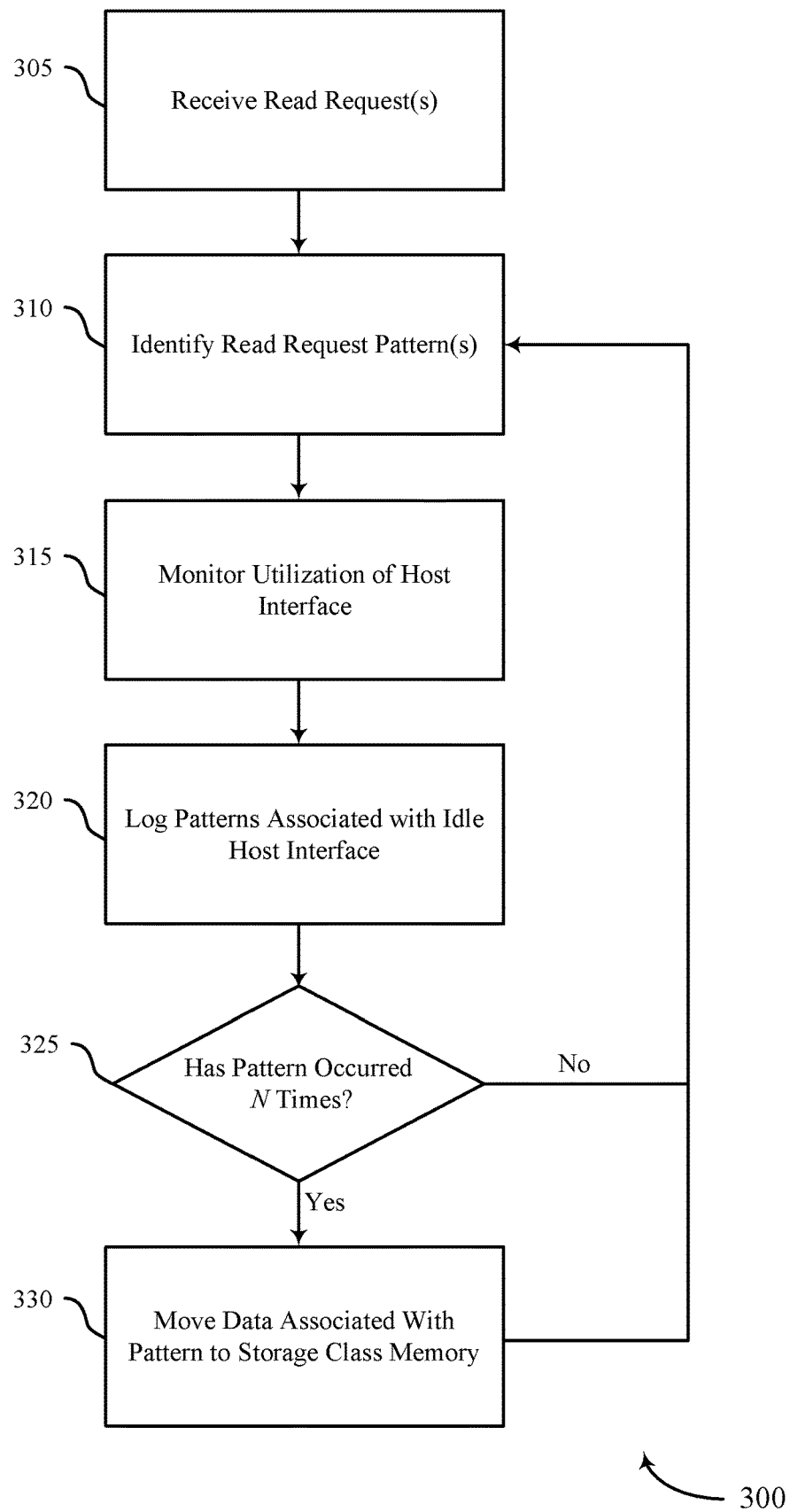
FIG. 3 illustrates an example of a process diagram illustrating a method or methods that support techniques for saturating a host interface in accordance with examples as disclosed herein.

FIG. 3 illustrates a process diagram 300 illustrating a method or methods that support techniques for saturating a host interface in accordance with examples as disclosed herein. The operations of the process diagram 300 may be implemented by a system or its components as described herein. For example, the operations of process diagram 300 may be performed by a system as described with reference to FIG. 1 and FIG. 2 (e.g., system 100 and system 200).

At block 305, one or more read requests may be received. For example, a memory system (e.g., memory system 210 of FIG. 2) may receive a read request from a host system (e.g., host system 205 of FIG. 2). The read request may be received at the memory system controller (e.g., memory system controller 215 of FIG. 2). The memory system controller may then initiate a read operation to access data associated with the read request and stored in a first memory (e.g. NAND memory 230 of FIG. 2). The memory system controller may receive additional read requests from the host system (e.g., as part of a pattern or sequence of read requests), where each additional read request may be associated with different data. In some cases, the first read request and the additional read requests may be associated with different sets of data. The memory system controller may initiate a read operation to access data associated with each read request received.

At block 310, one or more read request patterns may be identified in the received read requests. For example, the memory system controller may identify one or more read request patterns based on the received read requests. That is, the memory system controller may determine that a subset of the read requests that target the same storage locations (e.g., the same sets of data) are repeated and that the first memory is accessed in a similar manner each time. The memory system controller may record each identified read request pattern.

At block 315, the utilization of the host interface may be monitored. For example, the memory system controller may determine whether the host interface (e.g., host interface 220 of FIG. 2) enters an idle state or remains in a saturated state while performing read operations associated with the received read requests. In some cases, data may be communicated over host interface 220 at variable data rates (or data transfer speeds), based on whether the sets of data are read sequentially or in a scattered fashion. That is, the host interface may remain in a saturated state while a sequential read is performed, and the host interface may transition between an idle state and a saturated state while a scattered read is being performed.

Additionally, or alternatively, the memory system controller may determine whether the host interface remains in a saturated state by monitoring data transfer rates, durations associated with communicating data over the host interface, and/or an absence of data being communicated over the host interface. For example, if data is communicated within a threshold duration, the memory system controller may determine that the host interface remained in a saturated state. In some cases, the memory system controller may also monitor which read request patterns are associated with the idle state of the host interface, such as based on determining that read operations associated with the read request patterns are performed while the host interface transitions between an idle state and saturated state. For example, the memory system controller may detect that the host interface transitions between an idle state and a saturated state when the sets of data associated with a read request pattern are read from the first memory—e.g., if the first memory performs a scattered read to access the sets of data addressed by the read request pattern. In some cases, a component coupled with the host interface may provide an indication to the memory system controller when the host interface is in an idle state or operating in a reduced-utilization state.

At block 320, read request patterns that cause the host interface to transition between an idle state and a saturated state may be recorded. For example, the memory system controller may store (e.g., log or track) read request patterns associated with read operations that cause the host interface to transition between the idle state and the saturated state. In some cases, the memory system controller may determine the host interface remains in a saturated state while the read operations associated with a detected read request pattern are performed—e.g., when the read request pattern is associated with a sequential access pattern. If the memory system controller determines a read request pattern is associated with a saturated state throughout the read operation, the memory system controller may refrain from storing an indication of the read request pattern. In other examples, the memory system controller may determine the host interface transitions between an idle state and a saturated state while the read operations associated with a detected read request pattern are performed. If the memory system controller determines a read request pattern is associated with an idle state of the host interface, the memory system controller may store an indication of the read request pattern. That is, the memory system controller may store an indication of a read request pattern associated with accessing sets of data if the host interface transitions between an idle state and a saturated state while the sets of data are being communicated.

Additionally, or alternatively, the memory system controller may utilize a counter that is used to keep track of how many times the read request pattern has failed to saturate the host interface and/or has been stored. For example, a memory system controller may utilize a respective counter to keep track of how many times a read request pattern has been stored. In some examples, each time a same read request pattern fails to saturate the host interface, the memory system controller may increment a value of the respective counter. In some examples, the memory system controller may utilize a second respective counter to keep track of how many times a read request pattern has been identified.

At block 325, the quantity of times a read request pattern has been stored may be identified and compared with a threshold value. In some examples, the threshold value may be a predetermined quantity (e.g. ten (10)). In other examples, the threshold value may be associated with a percentage (e.g. 90%) of times a read request pattern is associated with the saturated state relative to a number of times the read request pattern has occurred. For example, the threshold value may be 90% (e.g., the host interface is in a saturated state 90% of the time a pattern is performed), and the memory system controller may determine the read request pattern associated with the sets of data is below the threshold as it causes the host interface to be in a saturated state 85% of the time. It is to be understood that these and any other specific numeric examples herein are merely examples provided solely for clarity in explanation and are not limiting of the claims.

If the memory system controller determines that the read request pattern satisfies the threshold value, the memory system controller may proceed to block 330. Otherwise, the memory system controller may return to block 310. That is, the controller may wait to initiate a transfer, from the first memory to a storage class memory (e.g., storage class memory 240 of FIG. 2), for sets of data accessed by a read request pattern that causes the host interface to enter an idle state until a threshold value is exceeded and/or satisfied by a counter associated with the read request pattern. In some examples, the memory system controller may determine the host interface transitions between an idle state and a saturated state while data is being communicated and refrain from initiating a transfer of the data because a value of the counter has failed to satisfy the threshold value. For example, the idle state may be associated with a read request pattern that is performed a single time (or a small number of times), and therefore, transferring the sets of data may not result in an increase in future data communication speeds over the host interface. If the memory system controller returns to block 310, the memory system controller may continue to receive read requests, identify read request patterns, monitor if the host interface is in a saturated state or an idle state, and store read request patterns that cause the host interface to transition between an idle state and a saturated state and update the counter accordingly. By continually monitoring the read request patterns that cause the host interface to transition between an idle state and a saturated state and transferring the sets of data associated with the pattern, the overall performance of the device may be improved.

At block 330, data may be transferred from the first memory to the storage class memory. For example, the memory system controller may initiate a transfer of the sets of data from the first memory to the storage class memory. That is, if the memory system controller updates the counter to a quantity that satisfies the threshold value, the memory system controller may transfer the sets of data associated with the read request pattern from the first memory to the storage class memory. In some examples, the memory system controller may transfer the sets of data during a time the host interface is idle. In other examples, the memory system controller may transfer the sets of data while the read request pattern is being executed—e.g., the sets of data may be stored in the storage class memory concurrently with the transmission of the sets of data over the host interface. After the memory system controller has transferred the sets of data, the memory system controller may update the L2Ps tables accordingly—e.g., the L2P tables may be updated to show that the sets of data are now located in the storage class memory. By transferring the sets of data to the storage class memory, the host interface may be maintained in a saturated state while executing subsequent read operations for the sets of data, and thus overall performance of the device may be improved. That is, as described herein and with reference to FIG. 2, the storage class memory may have reduced read latencies and may be configured to transfer the sets of data in a duration that is shorter than a duration the first memory takes to communicate the sets of data.

Figure 4:
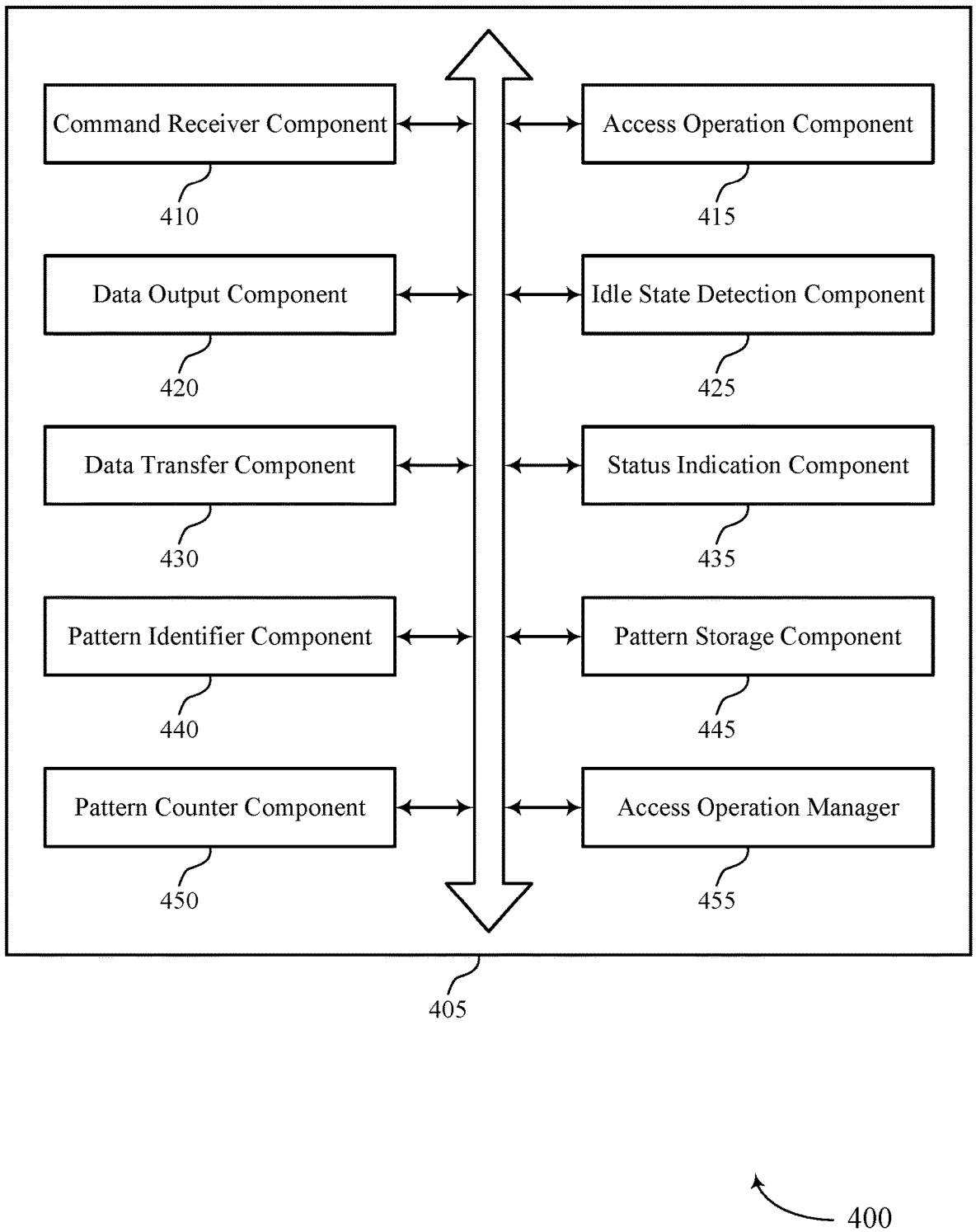
FIG. 4 shows a block diagram of a memory system that supports techniques for saturating a host interface in accordance with aspects of the present disclosure.

FIG. 4 shows a block diagram 400 of a memory system 405 that supports techniques for saturating a host interface in accordance with examples as disclosed herein. The memory system 405 may be an example of aspects of a memory system as described with reference to FIGS. 1-3. The memory system 405 may include a command receiver component 410, an access operation component 415, a data output component 420, an idle state detection component 425, a data transfer component 430, a status indication component 435, a pattern identifier component 440, a pattern storage component 445, a pattern counter component 450, and an access operation manager 455. Each of these modules may communicate, directly or indirectly, with one another (e.g., via one or more buses).

The command receiver component 410 may receive, at the memory system, a request for a set of data stored in a first memory device (e.g., a first memory array). In some examples, the command receiver component 410 may receive, at the memory system, a set of requests for sets of data stored in the first memory device. In some cases, the command receiver component 410 may receive a second request, at the memory system, for the set of data, where the set of data is stored in a second memory device (e.g., a second memory array) based on the transfer. In some instances, the command receiver component 410 may receive a second set of requests for the sets of data.

The access operation component 415 may execute a read operation at the first memory device based on receiving the request. In some examples, the access operation component 415 may execute a set of read operations at the first memory device based on receiving the set of requests and in accordance with the pattern. In some cases, the access operation component 415 may execute a second read operation at the second memory device based on receiving the second request. In some instances, the access operation component 415 may execute a set of read operations at the first memory device based on the set of requests, the set of read operations including the read operation, where detecting the idle state of the interface is based on monitoring the interface during the execution of the set of read operations. In some examples, the access operation component 415 may cause the first memory device to perform a random access memory pattern over a first duration.

The data output component 420 may communicate the set of data over an interface based on the read operation. In some cases, the data output component 420 may communicate the sets of data over the interface based on the set of read operations. In some instances, the data output component 420 may communicate the set of data over the interface based on the second read operation, where the interface is in a saturated state throughout the execution of the second read operation.

The idle state detection component 425 may detect an idle state of the interface during execution of the read operation. In some examples, the idle state detection component 425 may detect an idle state of the interface during execution of the set of read operations. In some cases, the idle state detection component 425 may identify a threshold duration associated with a saturated state of the interface being maintained throughout the read operation. In some instances, the idle state detection component 425 may determine a duration for communicating the set of data over the interface based on the request for the set of data, where detecting the idle state of the interface is based on determining that the duration exceeds the threshold duration.

In some examples, the idle state detection component 425 may identify a threshold data rate associated with saturating the interface. In some cases, the idle state detection component 425 may determine a data rate for communicating the set of data over the interface based on the execution of the read operation, where detecting the idle state of the interface is based on determining that the data rate is below the threshold data rate. In some instances, the idle state detection component 425 may monitor the interface during the execution of the read operation. In some examples, the idle state detection component 425 may determine an absence of data being communicated over the interface during a portion of the execution of the read operation based on the monitoring, where detecting the idle state of the interface is based on determining an absence of data being communicated. In some cases, the idle state detection component 425 may detect the idle state of the interface, the control component is based on receiving the indication from the interface.

The data transfer component 430 may transfer the set of data from the first memory device to a second memory device based on the idle state of the interface In some instances, the data transfer component 430 may transfer the sets of data from the first memory device to the second memory device based on the idle state of the interface.

The pattern identifier component 440 may identify, at the memory system, a pattern associated with the set of requests. In some examples, the pattern identifier component 440 may identify a pattern associated with a set of requests for data stored in the first memory device, the request for the set of data being one of the set of requests. In some cases, the pattern identifier component 440 may identify a first pattern as being associated with the idle state of the interface. In some instances, the pattern identifier component 440 may identify a second pattern as being associated with a saturated state of the interface. In some examples, the pattern identifier component 440 may classify the pattern associated with the set of requests as being associated with the idle state of the interface based on executing the set of read operations. In some cases, the pattern identifier component 440 may determine that the second set of requests have the pattern.

The status indication component 435 may display an indication of the absence of data being communicated over the interface based on the interface outputting the indication.

The pattern storage component 445 may store an indication of the pattern based on the idle state of the interface. In some instances, the pattern storage component 445 may store an indication of the pattern based on classifying the pattern as being associated with the idle state of the interface.

The pattern counter component 450 may initialize a counter. In some examples, the pattern counter component 450 may update the counter to a first value based on storing the pattern, where the set of data is transferred from the first memory device to the second memory device based on the first value of the counter. In some cases, the pattern counter component 450 may initialize a counter. In some instances, the pattern counter component 450 may update the counter to a first value based on storing the pattern associated with the set of requests. In some examples, the pattern counter component 450 may update the counter to a second value based on the second set of requests having the pattern, where transferring the sets of data from the first memory device to the second memory device is based on the second value satisfying a threshold value.

The access operation manager 455 may cause the second memory device to perform the random access memory pattern over a second duration, the first duration exceeding the second duration.

Figure 5:
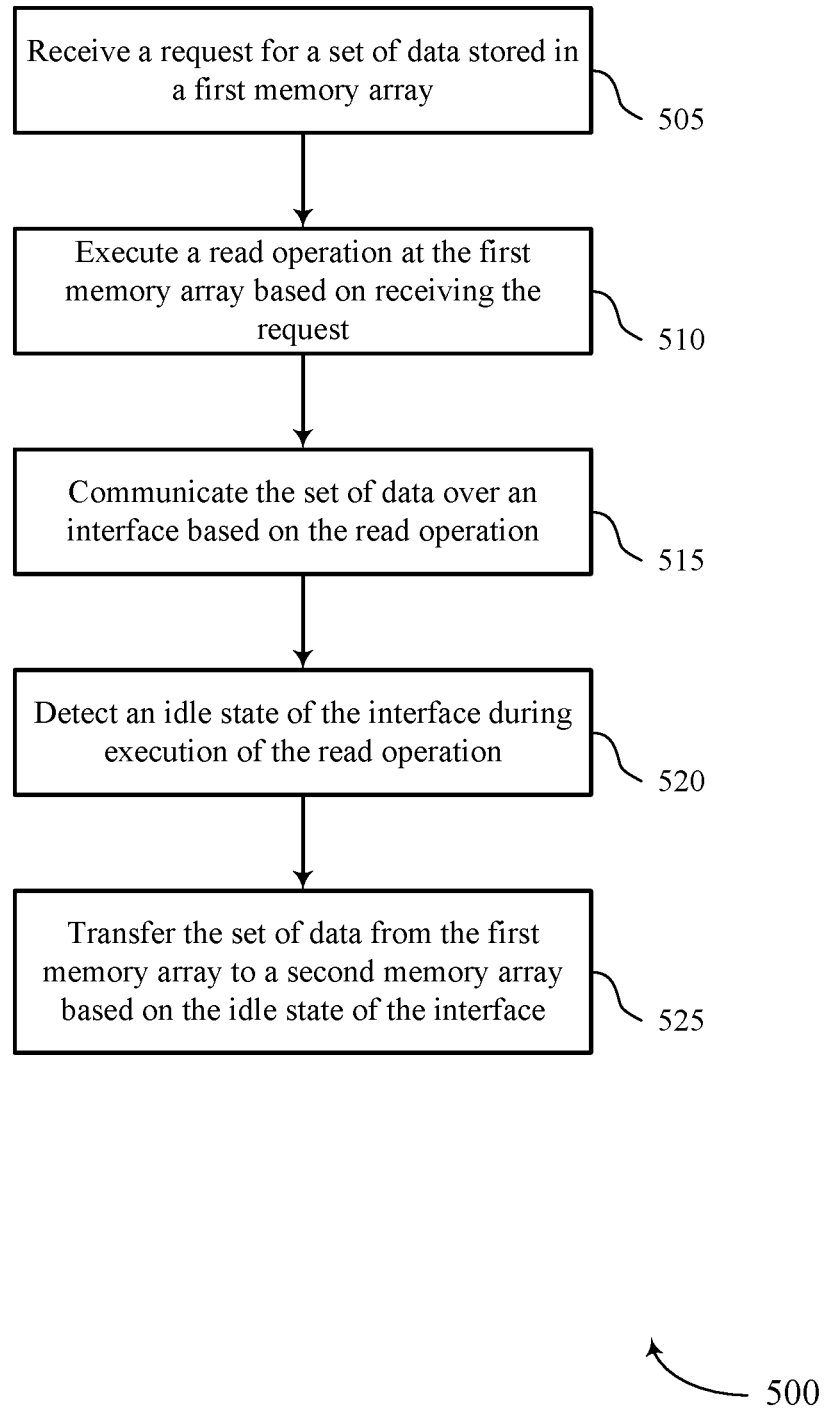
FIGS. 5 and 6 show flowcharts illustrating a method or methods that support techniques for saturating a host interface in accordance with examples as disclosed herein.

FIG. 5 shows a flowchart illustrating a method or methods 500 that supports techniques for saturating a host interface in accordance with aspects of the present disclosure. The operations of method 500 may be implemented by a memory system or its components as described herein. For example, the operations of method 500 may be performed by a memory system as described with reference to FIG. 4. In some examples, a memory system may execute a set of instructions to control the functional elements of the memory system to perform the described functions. Additionally, or alternatively, a memory system may perform aspects of the described functions using special-purpose hardware.

At 505, the memory system may receive, at the memory system, a request for a set of data stored in a first memory device (e.g., a first memory array). The operations of 505 may be performed according to the methods described herein. In some examples, aspects of the operations of 505 may be performed by a command receiver component as described with reference to FIG. 4.

At 510, the memory system may execute a read operation at the first memory device based on receiving the request. The operations of 510 may be performed according to the methods described herein. In some examples, aspects of the operations of 510 may be performed by an access operation component as described with reference to FIG. 4.

At 515, the memory system may communicate the set of data over an interface based on the read operation. The operations of 515 may be performed according to the methods described herein. In some examples, aspects of the operations of 515 may be performed by a data output component as described with reference to FIG. 4.

At 520, the memory system may detect an idle state of the interface during execution of the read operation. The operations of 520 may be performed according to the methods described herein. In some examples, aspects of the operations of 520 may be performed by an Idle state detection component as described with reference to FIG. 4.

At 525, the memory system may transfer the set of data from the first memory device to a second memory device (e.g., a second memory array) based on the idle state of the interface. The operations of 525 may be performed according to the methods described herein. In some examples, aspects of the operations of 525 may be performed by a data transfer component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for receiving, at the memory system, a request for a set of data stored in a first memory device, executing a read operation at the first memory device based on receiving the request, communicating the set of data over an interface based on the read operation, detecting an idle state of the interface during execution of the read operation, and transferring the set of data from the first memory device to a second memory device based on the idle state of the interface.

Some cases of the method 500 and the apparatus described herein may further include operations, features, means, or instructions for receiving a second request, at the memory system, for the set of data, where the set of data may be stored in the second memory device based on the transfer, executing a second read operation at the second memory device based on receiving the second request, and communicating the set of data over the interface based on the second read operation, where the interface may be in a saturated state throughout the execution of the second read operation.

Some instances of the method 500 and the apparatus described herein may further include operations, features, means, or instructions for identifying a threshold duration associated with a saturated state of the interface being maintained throughout the read operation, and determining a duration for communicating the set of data over the interface based on the request for the set of data, where detecting the idle state of the interface may be based on determining that the duration exceeds the threshold duration.

Some examples of the method 500 and the apparatus described herein may further include operations, features, means, or instructions for identifying a threshold data rate associated with saturating the interface, and determining a data rate for communicating the set of data over the interface based on the execution of the read operation, where detecting the idle state of the interface may be based on determining that the data rate may be below the threshold data rate.

Some cases of the method 500 and the apparatus described herein may further include operations, features, means, or instructions for monitoring the interface during the execution of the read operation, and determining an absence of data being communicated over the interface during a portion of the execution of the read operation based on the monitoring, where detecting the idle state of the interface may be based on determining an absence of data being communicated.

In some instances of the method 500 and the apparatus described herein, the interface outputs an indication of the absence of data being communicated over the interface, and detecting the idle state of the interface, the control component may be based on receiving the indication from the interface.

Some examples of the method 500 and the apparatus described herein may further include operations, features, means, or instructions for identifying a pattern associated with a set of requests for data stored in the first memory device, the request for the set of data being one of the set of requests.

Some cases of the method 500 and the apparatus described herein may further include operations, features, means, or instructions for executing a set of read operations at the first memory device based on the set of requests, the set of read operations including the read operation, where detecting the idle state of the interface may be based on monitoring the interface during the execution of the set of read operations.

Some instances of the method 500 and the apparatus described herein may further include operations, features, means, or instructions for storing an indication of the pattern based on the idle state of the interface.

Some examples of the method 500 and the apparatus described herein may further include operations, features, means, or instructions for initializing a counter, and updating the counter to a first value based on storing the pattern, where the set of data may be transferred from the first memory device to the second memory device based on the first value of the counter.

In some cases of the method 500 and the apparatus described herein, the first memory device may be configured to perform a random access memory pattern over a first duration, and the second memory device may be configured to perform the random access memory pattern over a second duration, the first duration exceeding the second duration.

Figure 6:
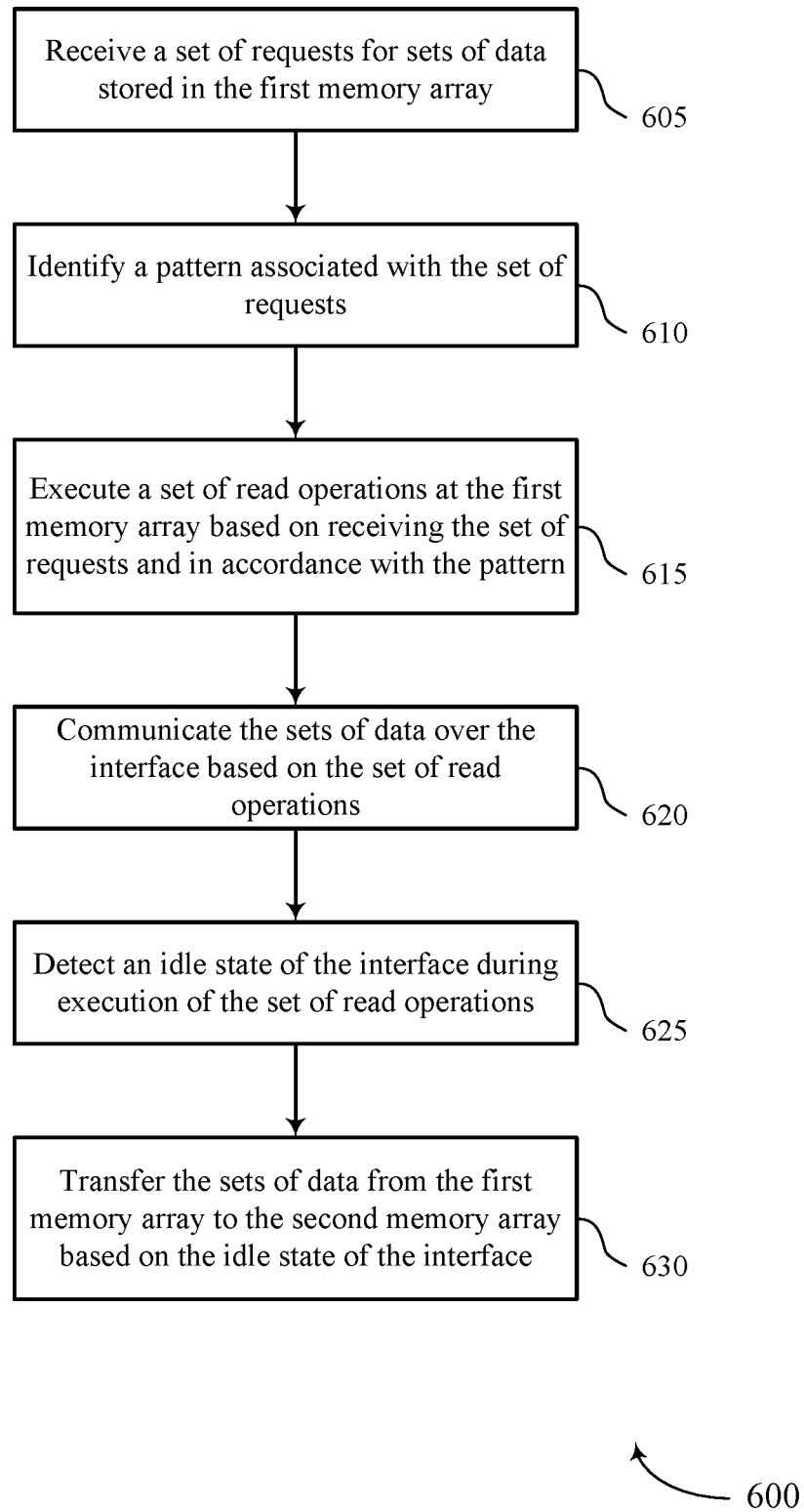

FIG. 6 shows a flowchart illustrating a method or methods 600 that supports techniques for saturating a host interface in accordance with aspects of the present disclosure. The operations of method 600 may be implemented by a memory system or its components as described herein. For example, the operations of method 600 may be performed by a memory system as described with reference to FIG. 4. In some examples, a memory system may execute a set of instructions to control the functional elements of the memory system to perform the described functions. Additionally, or alternatively, a memory system may perform aspects of the described functions using special-purpose hardware.

At 605, the memory system may receive, at the memory system, a set of requests for sets of data stored in the first memory device (e.g., a first memory array). The operations of 605 may be performed according to the methods described herein. In some examples, aspects of the operations of 605 may be performed by a command receiver component as described with reference to FIG. 4.

At 610, the memory system may identify, at the memory system, a pattern associated with the set of requests. The operations of 610 may be performed according to the methods described herein. In some examples, aspects of the operations of 610 may be performed by a pattern identifier component as described with reference to FIG. 4.

At 615, the memory system may execute a set of read operations at the first memory device based on receiving the set of requests and in accordance with the pattern. The operations of 615 may be performed according to the methods described herein. In some examples, aspects of the operations of 615 may be performed by an access operation component as described with reference to FIG. 4.

At 620, the memory system may communicate the sets of data over the interface based on the set of read operations. The operations of 620 may be performed according to the methods described herein. In some examples, aspects of the operations of 620 may be performed by a data output component as described with reference to FIG. 4.

At 625, the memory system may detect an idle state of the interface during execution of the set of read operations. The operations of 625 may be performed according to the methods described herein. In some examples, aspects of the operations of 625 may be performed by an Idle state detection component as described with reference to FIG. 4.

At 630, the memory system may transfer the sets of data from the first memory device to a second memory device (e.g., a second memory array) based on the idle state of the interface. The operations of 630 may be performed according to the methods described herein. In some examples, aspects of the operations of 630 may be performed by a data transfer component as described with reference to FIG. 4.

In some examples, an apparatus as described herein may perform a method or methods, such as the method 600. The apparatus may include features, means, or instructions (e.g., a non-transitory computer-readable medium storing instructions executable by a processor) for receiving, at the memory system, a set of requests for sets of data stored in the first memory device, identifying, at the memory system, a pattern associated with the set of requests, executing a set of read operations at the first memory device based on receiving the set of requests and in accordance with the pattern, communicating the sets of data over the interface based on the set of read operations, detecting an idle state of the interface during execution of the set of read operations, and transferring the sets of data from the first memory device to the second memory device based on the idle state of the interface.

Some cases of the method 600 and the apparatus described herein may further include operations, features, means, or instructions for identifying a first pattern as being associated with the idle state of the interface, and identifying a second pattern as being associated with a saturated state of the interface.

Some instances of the method 600 and the apparatus described herein may further include operations, features, means, or instructions for classifying the pattern associated with the set of requests as being associated with the idle state of the interface based on executing the set of read operations.

Some cases of the method 600 and the apparatus described herein may further include operations, features, means, or instructions for storing an indication of the pattern based on classifying the pattern as being associated with the idle state of the interface.

Some examples of the method 600 and the apparatus described herein may further include operations, features, means, or instructions for initializing a counter, and updating the counter to a first value based on storing the pattern associated with the set of requests.

Some instances of the method 600 and the apparatus described herein may further include operations, features, means, or instructions for receiving a second set of requests for the sets of data, determining that the second set of requests may have the pattern, and updating the counter to a second value based on the second set of requests having the pattern, where transferring the sets of data from the first memory device to the second memory device may be based on the second value satisfying a threshold value.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a first memory device including memory cells of a first type, a second memory device including memory cells of a second type, an interface coupled with the first memory device and the second memory device, a control component coupled with the first memory device, the second memory device, and the interface, where the control component is configured to cause the apparatus to, receive a request for a set of data stored in the first memory device, execute a read operation at the first memory device based on receiving the request, communicate the set of data over the interface based on the read operation, detect an idle state of the interface during execution of the read operation, and transfer the set of data from the first memory device to the second memory device based on the idle state of the interface.

In some cases, the controller may be further configured to receive a second request for the set of data, where the set of data may be stored in the second memory device based on the transfer, execute a second read operation at the second memory device based on receiving the second request, and communicate the set of data over the interface based on the second read operation, where the second memory device may be configured to cause the interface to may have a saturated state throughout the execution of the second read operation.

In some examples, the controller may be further configured to identify a threshold duration associated with a saturated state of the interface being maintained throughout the read operation, and determine a duration for communicating the set of data over the interface based on the request for the set of data, where, to detect the idle state of the interface, the control component may be configured to cause the apparatus to determine that the duration exceeds the threshold duration.

In some instances, the controller may be further configured to identify a threshold data rate associated with saturating the interface, and determine a data rate for communicating the set of data over the interface based on the execution of the read operation, where to detect the idle state of the interface, the control component may be configured to cause the apparatus to determine that the data rate may be below the threshold data rate.

In some examples, the controller may be further configured to monitor the interface during the execution of the read operation, and determine an absence of data being communicated over the interface during a portion of the execution of the read operation based on the monitoring, where, to detect the idle state of the interface, the control component may be configured to cause the apparatus to detect the absence of data.

In some cases, the interface may be configured to output an indication of the absence of data being communicated over the interface, and to detect the idle state of the interface, the control component may be configured to receive the indication from the interface.

In some cases, the controller may be further configured to identify a pattern associated with a set of requests for data stored in the first memory device, the request for the set of data being one of the set of requests.

In some examples, the controller may be further configured to execute a set of read operations at the first memory device based on the set of requests, the set of read operations including the read operation, where, to detect the idle state of the interface, the control component may be configured to cause the apparatus to monitor the interface during the execution of the set of read operations.

In some cases, the controller may be further configured to store an indication of the pattern based on the idle state of the interface.

In some instances, the controller may be further configured to initialize a counter, and update the counter to a first value based on storing the pattern, where the control component may be configured to cause the apparatus to transfer the set of data from the first memory device to the second memory device based on the first value of the counter.

In some examples, the memory cells of the first type include NAND memory cells that may be non-volatile and configured to be accessed at a block level.

In some cases, the memory cells of the second type include phase change memory cells, ferroelectric memory cells, or any combination thereof.

In some instances, the first memory device may be configured to perform a random access memory pattern over a first duration, and the second memory device may be configured to perform the random access memory pattern over a second duration, the first duration exceeding the second duration.

An apparatus is described. The apparatus may include a first memory device including a first type of memory cells, a second memory device including a second type of memory cells, an interface coupled with the first memory device and the second memory device, a control component coupled with the first memory device, the second memory device, and the interface, where the control component is configured to cause the apparatus to, receive a set of requests for sets of data stored in the first memory device, identify a pattern associated with the set of requests, execute a set of read operations at the first memory device based on receiving the set of requests and in accordance with the pattern, communicate the sets of data over the interface based on the set of read operations, detect an idle state of the interface during execution of the set of read operations, and transfer the sets of data from the first memory device to the second memory device based on the idle state of the interface.

In some instances, the controller may be further configured to identify a first pattern as being associated with the idle state of the interface and identify a second pattern as being associated with a saturated state of the interface.

In some cases, the controller may be further configured to classify the pattern associated with the set of requests as being associated with the idle state of the interface based on executing the set of read operations.

In some examples, the controller may be further configured to store an indication of the pattern based on classifying the pattern as being associated with the idle state of the interface.

In some cases, the controller may be further configured to initialize a counter, and update the counter to a first value based on storing the pattern associated with the set of requests.

In some instances, the controller may be further configured to receive a second set of requests for the sets of data, determine that the second set of requests may have the pattern, and update the counter to a second value based on the second set of requests having the pattern, where the control component may be configured to cause the apparatus to transfer the sets of data from the first memory device to the second memory device based on the second value satisfying a threshold value.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a first memory device comprising memory cells of a first type;
    a second memory device comprising memory cells of a second type;
    an interface coupled with the first memory device and the second memory device; and
    a control component coupled with the first memory device, the second memory device, and the interface, wherein the control component is configured to cause the apparatus to:
       receive a request for a set of data stored in the first memory device;
       execute a read operation at the first memory device based at least in part on receiving the request;
       communicate the set of data over the interface based at least in part on the read operation;
       detect an idle state of the interface during execution of the read operation; and
       transfer the set of data from the first memory device to the second memory device based at least in part on the idle state of the interface.

2. The apparatus of claim 1, wherein the control component is further configured to cause the apparatus to:
    receive a second request for the set of data, wherein the set of data is stored in the second memory device based at least in part on the transfer;
    execute a second read operation at the second memory device based at least in part on receiving the second request; and
    communicate the set of data over the interface based at least in part on the second read operation, wherein the second memory device is configured to cause the interface to have a saturated state throughout the execution of the second read operation.

3. The apparatus of claim 1, wherein the control component is further configured to cause the apparatus to:
    identify a threshold duration associated with a saturated state of the interface being maintained throughout the read operation; and
    determine a duration for communicating the set of data over the interface based at least in part on the request for the set of data, wherein, to detect the idle state of the interface, the control component is configured to cause the apparatus to determine that the duration exceeds the threshold duration.

4. The apparatus of claim 1, wherein the control component is further configured to cause the apparatus to:
    identify a threshold data rate associated with saturating the interface; and
    determine a data rate for communicating the set of data over the interface based at least in part on the execution of the read operation, wherein to detect the idle state of the interface, the control component is configured to cause the apparatus to determine that the data rate is below the threshold data rate.

5. The apparatus of claim 1, wherein the control component is further configured to cause the apparatus to:
    monitor the interface during the execution of the read operation; and
    determine an absence of data being communicated over the interface during a portion of the execution of the read operation based at least in part on the monitoring, wherein, to detect the idle state of the interface, the control component is configured to cause the apparatus to detect the absence of data.

6. The apparatus of claim 5, wherein:
    the interface is configured to output an indication of the absence of data being communicated over the interface; and
    to detect the idle state of the interface, the control component is configured to receive the indication from the interface.

7. The apparatus of claim 1, wherein the control component is further configured to cause the apparatus to:
    identify a pattern associated with a plurality of requests for data stored in the first memory device, the request for the set of data being one of the plurality of requests.

8. The apparatus of claim 7, wherein the control component is further configured to cause the apparatus to:
    execute a plurality of read operations at the first memory device based at least in part on the plurality of requests, the plurality of read operations including the read operation, wherein, to detect the idle state of the interface, the control component is configured to cause the apparatus to monitor the interface during the execution of the plurality of read operations.

9. The apparatus of claim 8, wherein the control component is further configured to cause the apparatus to:
    store an indication of the pattern based at least in part on the idle state of the interface.

10. The apparatus of claim 9, wherein the control component is further configured to cause the apparatus to:
    initialize a counter; and
    update the counter to a first value based at least in part on storing the pattern, wherein the control component is configured to cause the apparatus to transfer the set of data from the first memory device to the second memory device based at least in part on the first value of the counter.

11. The apparatus of claim 1, wherein the memory cells of the first type comprise NAND memory cells that are non-volatile and configured to be accessed at a block level.

12. The apparatus of claim 1, wherein the memory cells of the second type comprise phase change memory cells, ferroelectric memory cells, or any combination thereof.

13. The apparatus of claim 1, wherein:
the first memory device is configured to perform a random access memory pattern over a first duration; and
the second memory device is configured to perform the random access memory pattern over a second duration, the first duration exceeding the second duration.

14. An apparatus, comprising:
a first memory device comprising a first type of memory cells;
a second memory device comprising a second type of memory cells;
an interface coupled with the first memory device and the second memory device; and
a control component coupled with the first memory device, the second memory device, and the interface, wherein the control component is configured to cause the apparatus to:
receive a plurality of requests for sets of data stored in the first memory device;
identify a pattern associated with the plurality of requests;
execute a plurality of read operations at the first memory device based at least in part on receiving the plurality of requests and in accordance with the pattern;
communicate the sets of data over the interface based at least in part on the plurality of read operations;
detect an idle state of the interface during execution of the plurality of read operations; and
transfer the sets of data from the first memory device to the second memory device based at least in part on the idle state of the interface.

15. The apparatus of claim 14, wherein the control component is further configured to cause the apparatus to:
identify a first pattern as being associated with the idle state of the interface; and
identify a second pattern as being associated with a saturated state of the interface.

16. The apparatus of claim 14, wherein the control component is further configured to cause the apparatus to:
classify the pattern associated with the plurality of requests as being associated with the idle state of the interface based at least in part on executing the plurality of read operations.

17. The apparatus of claim 16, wherein the control component is further configured to cause the apparatus to:
store an indication of the pattern based at least in part on classifying the pattern as being associated with the idle state of the interface.

18. The apparatus of claim 17, wherein the control component is further configured to cause the apparatus to:
initialize a counter; and
update the counter to a first value based at least in part on storing the pattern associated with the plurality of requests.

19. The apparatus of claim 18, wherein the control component is further configured to cause the apparatus to:
receive a second plurality of requests for the sets of data;
determine that the second plurality of requests have the pattern; and
update the counter to a second value based at least in part on the second plurality of requests having the pattern, wherein the control component is configured to cause the apparatus to transfer the sets of data from the first memory device to the second memory device based at least in part on the second value satisfying a threshold value.

20. A non-transitory computer-readable medium storing code comprising instructions, which when executed by a processor of an electronic device, cause the electronic device to:
receive a request for a set of data stored in a first memory device;
execute a read operation at the first memory device based at least in part on receiving the request;
communicate the set of data over an interface based at least in part on the read operation;
detect an idle state of the interface during execution of the read operation; and
transfer the set of data from the first memory device to a second memory device based at least in part on the idle state of the interface.

21. The non-transitory computer-readable medium of claim 20, wherein the instructions, when executed by the processor of the electronic device, further cause the electronic device to:
receive a second request for the set of data, wherein the set of data is stored in the second memory device based at least in part on the transfer;
execute a second read operation at the second memory device based at least in part on receiving the second request; and
communicate the set of data over the interface based at least in part on the second read operation.

22. The non-transitory computer-readable medium of claim 20, wherein the instructions, when executed by the processor of the electronic device, further cause the electronic device to:
identify a threshold duration or threshold data rate associated with a saturated state of the interface being maintained throughout the read operation; and
determine a duration or data rate for communicating the set of data over the interface based at least in part on the request for the set of data, wherein, to detect the idle state of the interface, the instructions when executed by the processor further cause the electronic device to determine that the duration exceeds the threshold duration or that the data rate is below the threshold data rate.

23. A non-transitory computer-readable medium storing code comprising instructions, which when executed by a processor of an electronic device, cause the electronic device to:
receive a plurality of requests for sets of data stored in a first memory device;
identify a pattern associated with the plurality of requests;
execute a plurality of read operations at the first memory device based at least in part on receiving the plurality of requests and in accordance with the pattern;
communicate the sets of data over an interface based at least in part on the plurality of read operations;
detect an idle state of the interface during execution of the plurality of read operations; and
transfer the sets of data from the first memory device to a second memory device based at least in part on the idle state of the interface.

24. The non-transitory computer-readable medium of claim 23, wherein the instructions, when executed by the processor of the electronic device, further cause the electronic device to:
- identify a first pattern as being associated with the idle state of the interface; and
- identify a second pattern as being associated with a saturated state of the interface.

25. The non-transitory computer-readable medium of claim 23, wherein the instructions, when executed by the processor of the electronic device, further cause the electronic device to:
- classify the pattern associated with the plurality of requests as being associated with the idle state of the interface based at least in part on executing the plurality of read operations.

* * * * *